United States Patent
Zhu et al.

(10) Patent No.: US 9,543,212 B2
(45) Date of Patent: Jan. 10, 2017

(54) PREVENTING OVER-POLISHING OF POLY GATE IN METAL-GATE CMP

(71) Applicant: Semiconductor Manufacturing International (Shanghai) Corporation, Shanghai (CN)

(72) Inventors: Pulei Zhu, Shanghai (CN); Li Jiang, Shanghai (CN); Xiantao Li, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/663,389

(22) Filed: Mar. 19, 2015

(65) Prior Publication Data
US 2015/0340286 A1    Nov. 26, 2015

(30) Foreign Application Priority Data

May 26, 2014 (CN) .......................... 2014 1 0226155

(51) Int. Cl.
*H01L 21/3205*    (2006.01)
*H01L 21/8234*    (2006.01)
*H01L 21/28*    (2006.01)
*H01L 29/66*    (2006.01)
(Continued)

(52) U.S. Cl.
CPC ......... *H01L 21/82345* (2013.01); *H01L 21/28* (2013.01); *H01L 21/2807* (2013.01); *H01L 21/28088* (2013.01); *H01L 21/823842* (2013.01); *H01L 29/66* (2013.01); *H01L 29/66545* (2013.01); *H01L 21/3212* (2013.01)

(58) Field of Classification Search
CPC .................... H01L 21/02697; H01L 21/02107; H01L 21/02296; H01L 21/02362; H01L 21/441; H01L 21/76838; H01L 21/7684; H01L 21/7641; H01L 21/76843; H01L 21/76847; H01L 21/7685; H01L 21/76852
See application file for complete search history.

(56) References Cited

U.S. PATENT DOCUMENTS

6,072,221 A * 6/2000 Hieda ............... H01L 21/76897
257/344
6,583,012 B1 * 6/2003 Buynoski .......... H01L 21/28079
257/E21.165
(Continued)

*Primary Examiner* — Zandra Smith
*Assistant Examiner* — Evan Clinton
(74) *Attorney, Agent, or Firm* — Kilpatrick Townsend and Stockton LLP (57) ABSTRACT

A method for manufacturing a semiconductor device includes providing a substrate containing a front-end device that includes a first gate in a first-type transistor region and a second gate in a second-type transistor region, forming an interlayer dielectric layer on the semiconductor substrate, and planarizing the interlayer dielectric layer to expose the surface of the first and second gates. The method also includes forming a hard mask layer on the second gate, removing the first gate using the hard mask layer as a mask to form a trench, forming sequentially a work function metal layer and a metal gate layer in the trench, and removing a portion of the first work function metal layer and a portion of the metal gate layer that are higher than the interlayer dielectric layer to form a metal gate.

18 Claims, 4 Drawing Sheets (51) Int. Cl.
*H01L 21/8238* (2006.01)
*H01L 21/321* (2006.01)

(56) References Cited

U.S. PATENT DOCUMENTS

| | | | |
|---|---|---|---|
| 2004/0038535 A1* | 2/2004 | Barns | H01L 21/3212 |
| | | | 438/692 |
| 2009/0230479 A1* | 9/2009 | Hsu | H01L 21/823842 |
| | | | 257/369 |
| 2010/0072543 A1* | 3/2010 | Hsieh | H01L 29/4925 |
| | | | 257/331 |
| 2011/0057267 A1* | 3/2011 | Chuang | H01L 21/823842 |
| | | | 257/380 |
| 2012/0052682 A1* | 3/2012 | Kim | C09G 1/02 |
| | | | 438/689 |
| 2013/0082332 A1* | 4/2013 | Liu | H01L 29/4966 |
| | | | 257/369 |

* cited by examiner

PREVENTING OVER-POLISHING OF POLY GATE IN METAL-GATE CMP

CROSS-REFERENCES TO RELATED APPLICATIONS

This application claims priority to Chinese patent application No. 2014101226155.7, filed on May 26, 2014, the content of which is incorporated herein by reference in its entirety.

BACKGROUND OF THE INVENTION

The present invention relates to semiconductor devices, and more particularly to techniques for the fabrication of semiconductor devices in 32 nm technology nodes and beyond.

The use of metal materials as gate conductors with high-k dielectrics has become prevalent in high-k metal gate (HKMG) process technology nodes at 32 nm and below (e.g., 28 nm). The use of aluminum or aluminum alloy for metal gate electrodes has cost and performance advantages so that aluminum gates have been widely used. The chemical mechanical polishing (CMP) process of aluminum gates is a very important process for manufacturing high-k metal gate transistors.

In order to increase the gap filling space, an aluminum gate CMP process is typically implemented in two steps: a CMP process for N-type aluminum gate transistors and a CMP process for P-type aluminum gate transistors.

In the process of performing CMP on the aluminum gate of a P-type transistor, a polishing pad can have simultaneously contact with the aluminum gate of the P-type transistor, the polysilicon gate of the polysilicon gate transistor, the dummy gate (typically polysilicon) of the NMOS transistor, and the interlayer dielectric layer. Since a conventional CMP process utilizes a polishing slurry that has a polysilicon removal rate greater than the aluminum removal rate, the polysilicon gate tends to be over-polished. Furthermore, an over-polishing of polysilicon gate may occur during the CMP process of the aluminum gate of the N-type transistors.

Thus, prior art techniques of removing the metal gate using a CMP process face the problems of over-polishing since the slurry of the CMP polishing has a polysilicon removal rate greater than the removal rate of a metal material (e.g., aluminum), leading to excessive over-polishing of the dummy gate and the polysilicon gate and a decrease in performance of a semiconductor device.

In view of the foregoing, there is a need for a novel method and apparatus for manufacturing a semiconductor device that can overcome the deficiencies of the prior art.

BRIEF SUMMARY OF THE INVENTION

Embodiments of the present invention provide a method for manufacturing a semiconductor device structure and a semiconductor device that can easily remove a hard mask layer without impacting the performance and yield of the semiconductor device.

In accordance with the present invention, a method for manufacturing a semiconductor device includes providing a semiconductor substrate containing a front-end device, the front-end device may include a first gate in a first type transistor region and a second gate in a second type transistor region, forming an interlayer dielectric layer on the semiconductor substrate, and performing a first chemical mechanical polishing (CMP) process on the interlayer dielectric layer to expose a surface of the first gate and a surface of the second gate (S101). The method also includes removing a portion of the second gate so that the second gate is lower than the interlayer dielectric layer (S102), forming a hard mask layer on the first gate, the second gate, and the interlayer dielectric layer, removing a portion of the hard mask layer disposed on the first type transistor region, and removing the first gate by etching using the hard mask layer as a mask to form a trench (S103). The method further includes forming a first work function metal layer in the trench (S104), forming a first metal gate layer on the first work function metal layer, and forming a metal gate by performing a second CMP process to remove a portion of the first work function metal layer and a portion of the metal gate layer that are higher than the interlayer dielectric layer (S105).

In one embodiment, removing the portion of the second gate may include removing a portion of the first gate so that the first gate and the second gate have a height (thickness) less than a height (thickness) of the interlayer dielectric layer.

In one embodiment, removing the portion of the first gate and the portion of the second gate may include performing a CMP process that has a removal rate higher than a removal rate of the interlayer dielectric layer. The CMP process may include a slurry A7100 of Cabot Microelectronics Corporation.

In one embodiment, the portion of the second gate being removed has a thickness in a range between 20 Angstroms and 80 Angstroms.

In one embodiment, the first gate and the second gate may include polysilicon.

In one embodiment, after the first CMP process is performed, the surface of the first gate and the surface of the second gate are coplanar with the surface of the interlayer dielectric layer.

In one embodiment, the hard mask layer may include titanium nitride.

In one embodiment, forming the hard mask layer may include a deposition process.

In one embodiment, the metal gate layer may include aluminum or aluminum alloy.

In one embodiment, the second CMP process may include a slurry A7100 of Cabot Microelectronics Corporation.

In one embodiment, the method may further include performing a third CMP process to expose a surface of the second gate (S106). The third CMP process may stop when the surface of the second gate is exposed.

In one embodiment, the method may further include, after the third CMP process, removing the second gate in the second type transistor regions to form a second trench, forming a second work function metal layer in the trench, forming a second metal gate layer on the second work function metal layer, and performing a CMP process to remove a portion of the second work function metal layer and a portion of the second metal gate layer to form the second gate.

In one embodiment, the first type transistor region may include a P-type metal gate transistor, and the second type transistor region may include an N-type metal gate transistor, or the first type transistor region may include an N-type metal gate transistor, and the second type transistor region may include a P-type metal gate transistor, or the first type transistor region may include a P-type metal gate transistor, and the second type transistor region may include a polysilicon transistor, or the first type transistor region may include an N-type metal gate transistor, and the second type transistor region may include a polysilicon transistor.

The following description, together with the accompanying drawings, will provide a better understanding of the nature and advantages of the claimed invention.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," "directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms such as "under," "below," "underneath," "over," "on," "above," "bottom," and "top" are used herein to described a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The terms "substrate" and "wafer" may be used alternatively and may include silicon-on-insulator (SOI) or silicon-on-sapphire (SOS) technology, doped and undoped semiconductors, epitaxial layers of silicon supported by a base semiconductor foundation, and other semiconductor structures.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on", "side" (as in "sidewall"), "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

Embodiment 1

According to some embodiments of the present invention, a method for fabricating a semiconductor device can prevent over-polishing of other gate electrodes (e.g., polysilicon gates) when performing a chemical mechanical polishing (CMP) process to metal gates, thereby improving performance and yield of a semiconductor device.

FIGS. 1A to 1F are simplified cross-sectional views illustrating process steps of forming a semiconductor device according to one embodiment of the present invention. FIG. 2 is a simplified flow chart of a method of fabricating a semiconductor device according to one embodiment of the present invention.

Figure 1A:
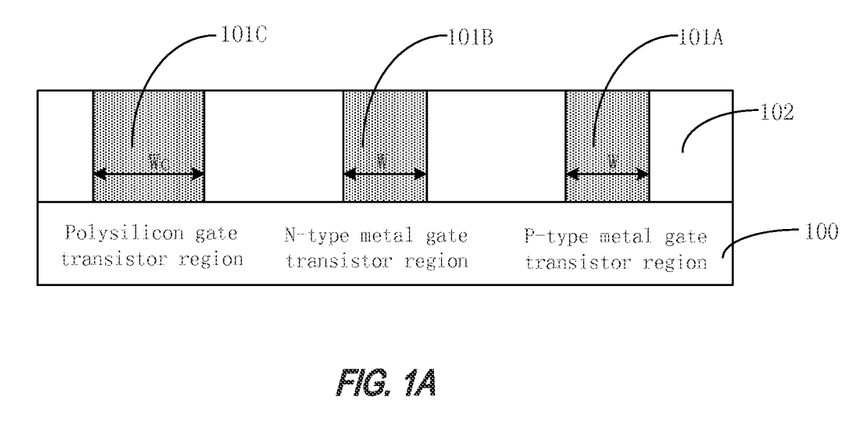
FIGS. 1A to 1F are cross-sectional views depicting stages of a method of manufacturing a semiconductor device according to one embodiment of the present invention.
Figure 2:
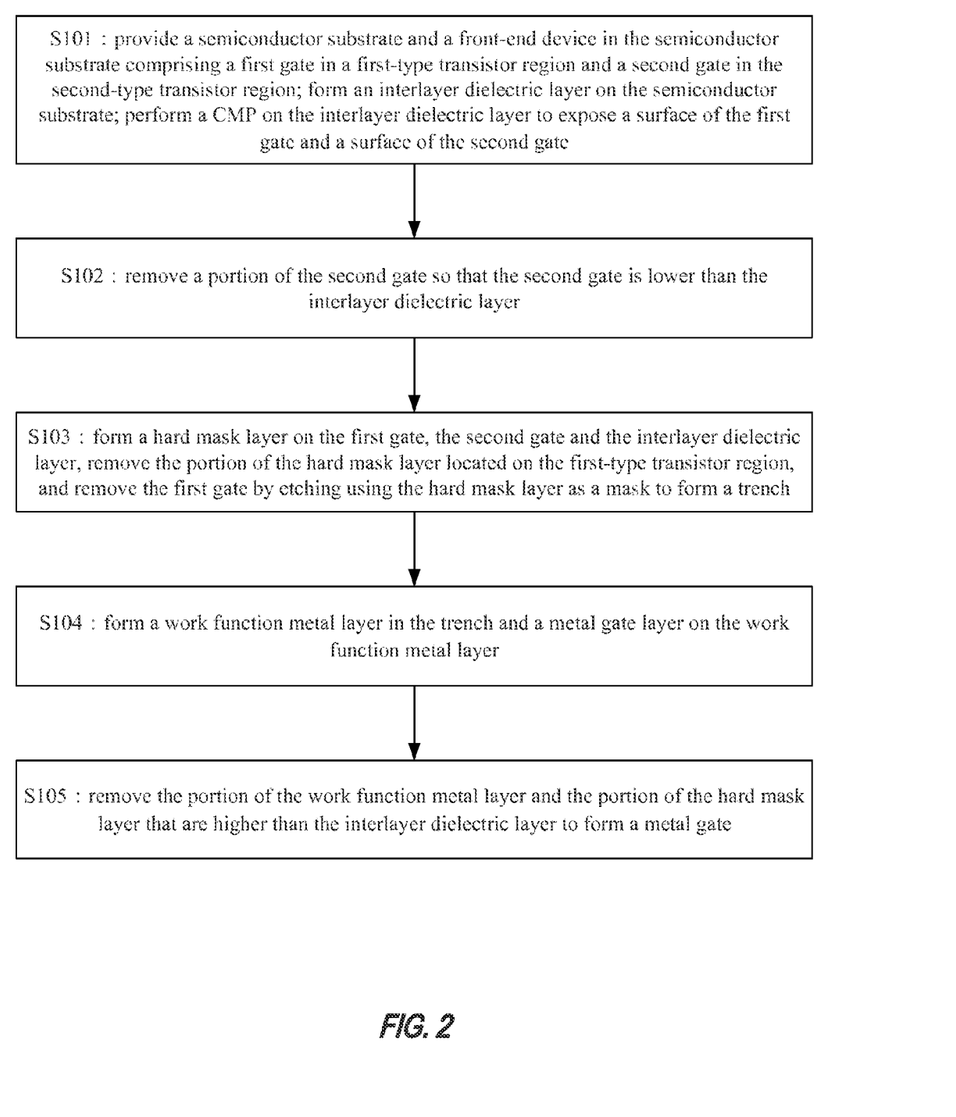
FIG. 2 is a simplified flow chart of a method of manufacturing a semiconductor device according to one embodiment of the present invention.

With reference to FIGS. 1A-1F and FIG. 2, a method of fabricating a semiconductor device may include the following steps:

Step A1: provide a semiconductor substrate 100 and a front-end device on the semiconductor substrate, the front-end device comprising a first dummy gate 101A in a P-type metal-gate transistor region, a second dummy gate 101B in an N-type metal-gate transistor region, and a polysilicon gate 101C in a polysilicon-gate transistor region; form an interlayer dielectric layer 102 on the semiconductor substrate; perform a first CMP process on the interlayer dielectric layer to expose a surface of the first dummy gate, a surface of the second dummy gate, and a surface of the polysilicon gate, as shown in FIG. 1A.

Through step A1, the first dummy gate 101A, the second dummy gate 101B, the polysilicon gate 101C each have an exposed top surface that is flush (coplanar) with the even surface of the interlayer dielectric layer 102, as shown in FIG. 1A.

In step A1, the CMP process is performed to planarize the interlayer dielectric layer 102 (typically formed of silicon oxide) and preferably to avoid any unduly etching of the first dummy gate 101A, the second dummy gate 101B, and the polysilicon gate 101C.

In the embodiment, the front-end device is referred to a structure that has been formed on the semiconductor substrate and may contain some components, but the structure has not been completely processed to be a final semiconductor device. Of course, the front-end device is shown in FIG. 1A by way of example only, not by way of limitation. In other words, the front-end device may contain other components.

The P-type metal gate transistor region is referred to a region that is used to form one or more P-type metal gate transistors. The N-type metal gate transistor region is referred to a region that is used to form one or more N-type metal gate transistors. The polysilicon gate transistor region is referred to a region that is used to form one or more polysilicon gate transistors.

It is to be understood that polysilicon gate transistors are normal transistors to distinguish from high-k metal gate transistors. Polysilicon gate transistors can be N-type transistors or P-type transistors.

In the present disclosure, semiconductor substrate 100 may be a monocrystalline silicon substrate, SOI substrate, and other suitable substrate. First and second dummy gates 101A, 101B may be made of a same material as that of polysilicon gate 101C, i.e., a polysilicon material. In one exemplary embodiment, first and second dummy gates 101A, 101B may have the same height as polysilicon gate 101C, and can be formed together with polysilicon gate 101C using a same manufacturing process. It is understood that the number of first, second and polysilicon gates in the embodiment can be any integer number N. In the example shown in FIG. 1A, only one first dummy gate 101A, one second dummy gate 101B, and one polysilicon gate 101C are used for the respective P-type, N-type and polysilicon gate transistor region, i.e., N=1, but it is understood that the number N is arbitrary chosen for describing the example embodiment and should not be limiting. In other words, the number N can be any positive integer.

In the embodiment, interlayer dielectric layer 102 is formed on semiconductor substrate 100 and filling the air gaps or voids disposed between first dummy gate 101A, second dummy gate 101B, and polysilicon gate 101C.

Figure 1B:
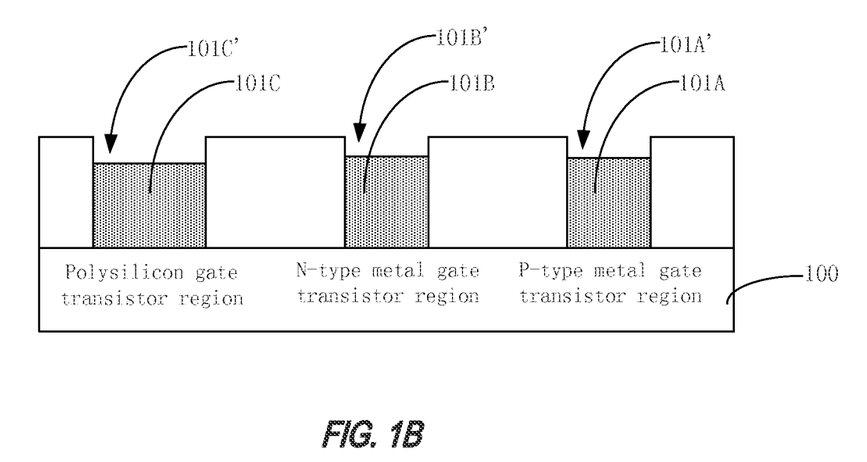

Step A2: perform a second CMP process on the first dummy gate 101A, the second dummy gate 101B, and the polysilicon gate so that the top surface of the first dummy gate 101A, the top surface of the second dummy gate 101B, and the top surface of the polysilicon gate are lower than the top surface of the interlayer dielectric layer, as shown in FIG. 1B.

In an embodiment, the removed portion (thickness) of first dummy gate 101A, the removed portion (thickness) of second dummy gate 101B, and the removed portion (thickness) of polysilicon gate each are in the range between about 20 Angstroms to about 80 Angstroms.

After the second CMP process has been performed, the first dummy gate 101A, the second dummy gate 101B, and the polysilicon gate each have a groove or recess 101A', 101B', and 101C', respectively, as shown in FIG. 1B. The grooves or recesses 101A', 101B', and 101C' each have a height or depth in the range between 20 Angstroms to about 80 Angstroms.

In an embodiment, the polysilicon gate 101C may have a lateral dimension Wc that is greater than a lateral dimension W (Wc >W) of the first and second dummy gates 101A and 1201B, as shown in FIGS. 1A and 1B. Due to the pattern loading effect of the second CMP process, the polysilicon gate 101C is removed at a greater thickness than other regions, such as the first and second dummy gates 101A, 101B, as shown in FIG. 1B. In other words, the polysilicon gate 101C has a height less than the height of the first and second dummy gates 101A, 101B.

In step A2, the second CMP process uses a polishing process that has a higher removal rate for the first dummy gate 101A, the second dummy gate 101B and the polysilicon gate 101C (polysilicon as the main material) than the removal rate of the interlayer dielectric layer 102 (typically silicon oxide), the polishing process may use an appropriate polishing slurry. In an exemplary embodiment, the used polishing slurry is aluminum slurry A7100 for advanced node high-k metal gate process of Cabot Microelectronics Corporation.

Step A2 is not present in the prior art. The present invention adds step A2 for the second CMP process to cause the top surface of the first dummy gate 101A, the second dummy gate 101b, and the polysilicon gate 101C to be below the top surface of the interlayer dielectric layer, in order to avoid excessive removal of the polysilicon gate 101C in subsequent CMP processes of the metal-gate layer.

Experiments showed that the removed thickness of the first dummy gate 101A, the second dummy gate 101b, and the polysilicon gate 101C according to the present invention is much less than the removed thickness of the polysilicon gate due to over-polishing in the prior art CMP processes.

According to the present invention, the first dummy gate 101A, the second dummy gate 101b, and the polysilicon gate 101C can be formed to have an initial height that is over a predetermined (desired) height to ensure that the final height has the desired dimension after the CMP process has been performed.

Further, the top portion of the first dummy gate 101A, the second dummy gate 101B, and the polysilicon gate 101C may be removed using other techniques such as etching so that their top surface is below the surface of the interlayer dielectric layer. Moreover, the second step A2 is performed to ensure that the top surface of the second dummy gate 101B and the polysilicon gate 101C is below the top surface of the interlayer dielectric layer, the top portion of the first dummy gate 101A may not be removed at the same time.

Figure 1C:
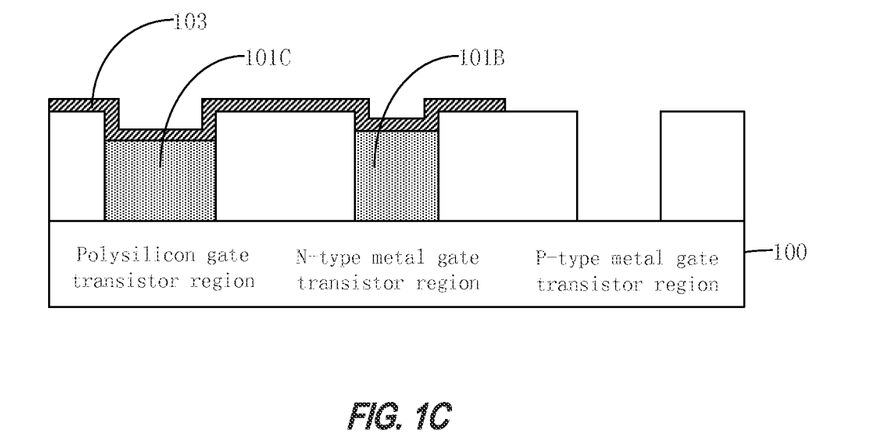

Step A3: form a hard mask layer 103 on the first dummy gate 101A, the second dummy gate 101B, the polysilicon gate 101C, and the interlayer dielectric layer; remove the portion of the hard mask layer 103 over the P-type metal-gate transistor region by etching; and remove the first dummy gate 101A of the P-type transistor region using the hard mask layer 103 as a mask, as shown in FIG. 1C.

In an embodiment, the hard mask layer 103 may be of titanium nitride (TiN) or other suitable materials. The slurry used in the subsequent CMP process for planarizing the metal (aluminum) gate may have a removal rate of the hard mask layer 103 lower than the removal rate of the metal gate.

The hard mask layer 103 may be formed using a deposition process or other suitable processes. Before removing the portion of the hard mask layer 103 over the P-type metal gate transistor region, a photoresist layer having an opening exposing the P-type metal-gate transistor region may be formed on the hard mask layer 103.

In this step, the removal of the portion of the hard mask layer over the P-type metal-gate transistor region and the removal of the dummy gate 101A can use either dry etch or wet etch approach. The removal of the portion of the hard mask layer over the P-type metal-gate transistor region and the removal of the dummy gate 101A can be performed using a same etching process or different etching processes.

Figure 1D:
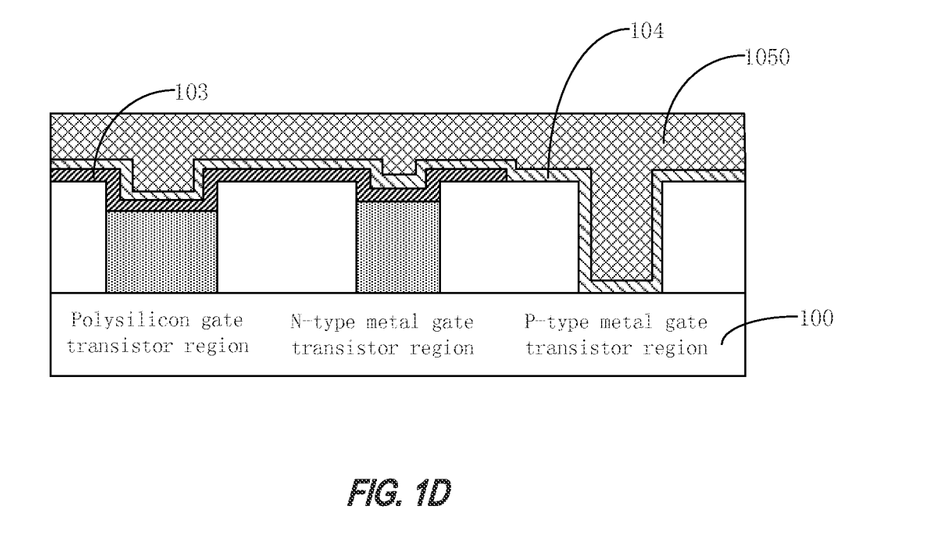

Step A4: form a first work function metal layer 104 in the location of the removed first dummy gate 101A, and form a metal gate layer 1050 on the first work function metal layer 104, as shown in FIG. 1D.

In an embodiment, the first work function metal layer 104 may be aluminum or other suitable materials. The metal gate layer 1050 may be aluminum, aluminum alloy or other suitable materials.

The first work function metal layer 104 may be formed by a deposition process or other suitable processes. The metal gate layer 1050 may be formed by a deposition process or other suitable processes.

Figure 1E:
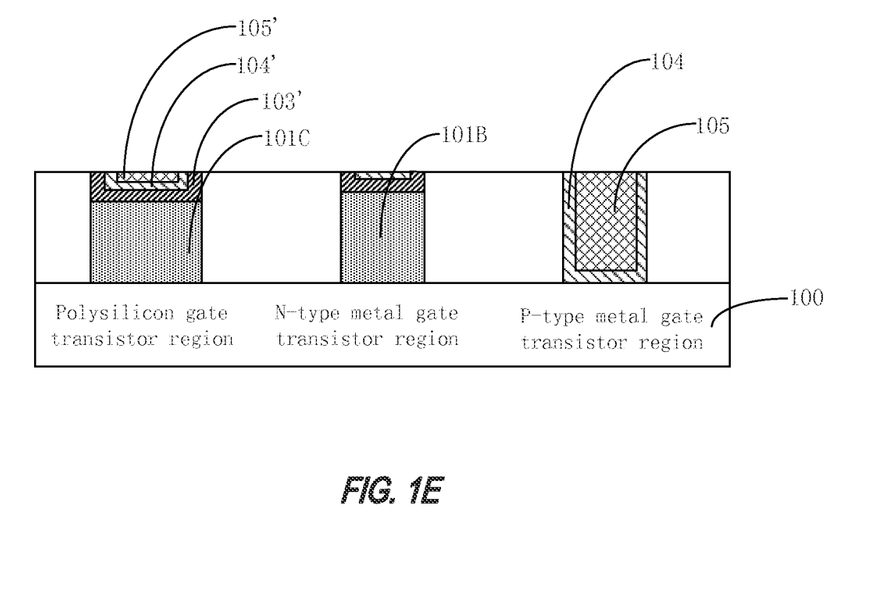

Step A5: perform a third CMP process to remove the metal gate layer 1050, a portion of the first work function metal layer 104 and a portion of the hard mask layer 103 that are higher than the surface of the interlayer dielectric layer 102 to form a first metal gate 105, as shown in FIG. 1E.

In this step, the third CMP process can be controlled such a way that it stops at the top surface of the interlayer dielectric layer 102, in order to avoid over-polishing and damaging the polysilicon gate 101C.

In this step, the slurry used in the third CMP process can have a high removal rate for the metal gate layer 1050 and for the first work function metal layer 104. In an exemplary embodiment, the used polishing slurry is aluminum slurry A7100 for advanced node high-k metal gate process of Cabot Microelectronics Corporation.

In this step, since the metal gate layer 1050 is formed on the first work function layer 104 and the hard mask layer 103 in the groove 101C' of the polysilicon gate 101C, it is possible to prevent over-polishing the polysilicon gate 101C in the third CMP process. In general, after this step, residues 104' of the first work function metal layer 104 and residues 105' of the first metal gate 105 and residues 103' of the hard mask layer 103 may remain on the top surface of the polysilicon gate 101C, as shown in FIG. 1E.

In addition, for the same reason, the metal gate layer 1050, the first work function metal layer 104 and the hard mask layer 103 that are formed on the second dummy gate 101B protect the second dummy gate 101B in the third CMP process, in order to ensure that the metal gate electrode corresponding to the second dummy gate 101B will have a certain height.

Figure 1F:
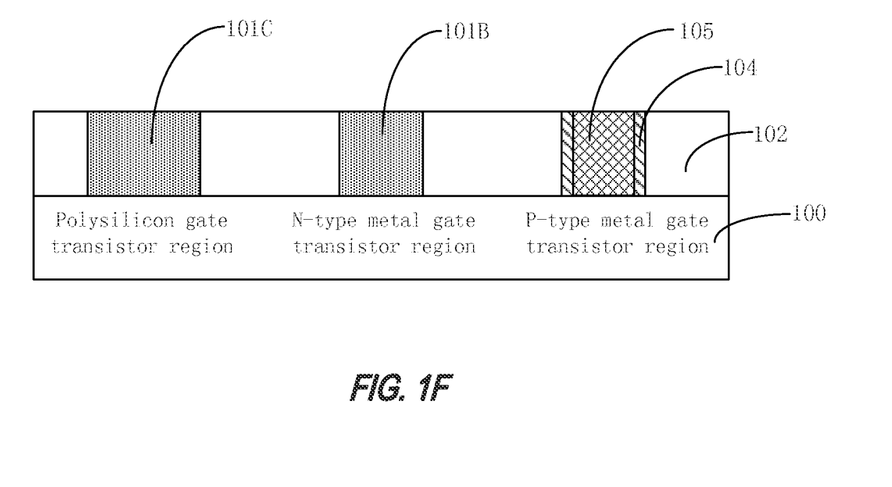

Step A6: perform a fourth CMP process to expose the surface of the polysilicon gate 101C and the second dummy gate 101B, as shown in FIG. 1F.

In an embodiment, the fourth CMP process stops above the polysilicon gate 101C and the second dummy gate 101B, as shown in FIG. 1F.

In the fourth CMP process, a portion of the first metal gate electrode 105 and a portion of the first work function metal layer 104 are removed.

In this step, the fourth CMP process should use an abrasive slurry that has a low polysilicon removal rate in order to avoid excessive over-polishing of the polysilicon gate 101C and the second dummy gate 101B.

Through the fourth CMP process, residues 105' of the first metal gate 105, residues 104' of the first work function layer 104, and residues 103' of the hard mask layer 103 are completely removed, as shown in FIG. 1F.

The following steps, also referring to steps A2 to A6, may further be performed after step A6: removing the second dummy gate 101B in the N-type metal-gate transistor region; forming a second work function metal layer in the location where the second dummy gate 101B; has been removed, and forming a second metal gate layer on the second work function metal layer.

In the embodiment, a metal gate may be first formed in the N-type metal-gate transistor region, and then a metal gate is formed in the P-type metal-gate transistor region. The step of forming a metal gate in the N-type and the step of forming a metal gate in the P-type metal-gate transistor region can be interchanged in sequence.

According to the embodiment, in addition to the specific example illustrated in FIGS. 1A to 1F, the method of fabricating a semiconductor device may be used in a variety of applications. For example, the method can be used in fabricating a front-end device comprising a first dummy gate 101A and a second dummy gate 101B, or a first dummy gate 101A and multiple polysilicon gates 101C.

In the embodiment, the first dummy gate 101A may be referred to as the first gate electrode, the second dummy gate 101B and/or the polysilicon gate 101C may be referred to as the second gate electrodes. According to the present invention, when the metal gate electrode is formed in the location of the first gate, the CMP process does not cause excessive over-polishing of the second gate. The object of the invention is that, when removing a portion of the second gate to lower the top surface of the second gate below the surface of the interlayer dielectric layer and performing a CMP process to the metal gate in the location of the first gate, the first work function metal layer and the hard mask layer disposed on the second gate can protect the second gate.

In accordance with the present invention, the method of fabricating a semiconductor device may include the steps of removing a portion of the second gate to cause the top surface of the second gate below the top surface of the interlayer dielectric layer and performing a CMP process to the first metal gate, the second gate is protect by the work function metal layer and the hard mask layer disposed thereon, thus an over-polishing of the second gate (i.e., the dummy gate or the polysilicon gate) can be prevented to ensure the height of the second gate, thereby improving the performance and yield of the semiconductor device.

FIG. 2 is a simplified flow chart of a method of manufacturing a semiconductor device according to one embodiment of the present invention. The method may include:

S101: provide a semiconductor substrate and a front-end device in the semiconductor substrate, the front-end device comprising a first gate in a first-type transistor region and a second gate in the second-type transistor region; form an interlayer dielectric layer on the semiconductor substrate; perform a CMP process on the interlayer dielectric layer to expose a surface of the first gate and a surface of the second gate;

S102: remove a portion of the second gate so that the top surface of the second gate is lower than the top surface of the interlayer dielectric layer;

S103: form a hard mask layer on the first gate, the second gate and the interlayer dielectric layer; remove the portion of the hard mask layer located on the first-type transistor region; and remove the first gate by etching using the hard mask layer as a mask to form a trench;

S104: form a work function metal layer in the trench and a metal gate layer on the work function metal layer;

S105: remove the portion of the work function metal layer and the portion of the hard mask layer that are higher than the top surface of the interlayer dielectric layer to form a metal gate.

Embodiment 2

Embodiments of the present invention provide an electronic device, which may include an electronic component and a semiconductor device electrically connected to the electronic component. The semiconductor device can be manufactured according to the method described in the above sections.

In an embodiment, the electronic device may include a semiconductor device fabricated using the above-described method. The electronic device may be a mobile phone, a laptop, a netbook, a tablet PC, a game console, a TV, a DVD player, a GPS device, a camera, a voice recorder, MP3, MP4, PSP, and other semiconductor devices including intermediate products and electronic components that are manufactured using the above-described method to improve performance and yield.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although three gate transistor regions (P-type, N-type, polysilicon gate transistor regions) are used, it is understood that the number of the transistor regions can be more or fewer than three in other embodiments. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A method for manufacturing a semiconductor device, the method comprising:
   providing a semiconductor substrate comprising a front-end device, the front-end device comprising a first gate in a first type transistor region and a second gate in a second type transistor region;
   forming an interlayer dielectric layer on the semiconductor substrate;
   performing a first chemical mechanical polishing (CMP) process having a removal rate of the first and second gates higher than a removal rate of the interlayer dielectric layer on the interlayer dielectric layer so that a surface of the first gate and a surface of the second gate are below a surface of the interlayer dielectric layer after the first CMP process;
   removing a portion of the second gate so that the second gate is lower than the interlayer dielectric layer;
   forming a hard mask layer on the first gate, the second gate, and the interlayer dielectric layer;
   removing a portion of the hard mask layer disposed on the first type transistor region;
   removing the first gate by etching using the hard mask layer as a mask to form a trench;
   forming a first work function metal layer in the trench and on the hard mask layer over the second gate;
   forming a first metal gate layer on the first work function metal layer;
   forming a metal gate by performing a second CMP process to remove a portion of the first work function metal layer and a portion of the metal gate layer that are higher than the interlayer dielectric layer; and
   removing a portion of the first work function metal layer, a portion of the metal gate layer, and a portion of the hard mask layer over the second gate to expose the second gate.

2. The method of claim 1, wherein removing the portion of the second gate comprises removing a portion of the first gate so that the first gate and the second gate have a height (thickness) less than a height (thickness) of the interlayer dielectric layer.

3. The method of claim 2, wherein removing the portion of the first gate and the portion of the second gate comprises performing a CMP process that has a removal rate of the first and second gates higher than a removal rate of the interlayer dielectric layer.

4. The method of claim 1, wherein the portion of the second gate being removed has a thickness in a range between 20 Angstroms and 80 Angstroms.

5. The method of claim 1, wherein the first gate and the second gate comprise polysilicon.

6. The method of claim 1, wherein, after the first CMP process, the first gate, the second gate, and the interlayer dielectric layer are coplanar.

7. The method of claim 1, wherein the hard mask layer comprises titanium nitride.

8. The method of claim 1, wherein forming the hard mask layer comprises a deposition process.

9. The method of claim 1, wherein the metal gate layer comprises aluminum or aluminum alloy.

10. The method of claim 1, further comprising:
    performing a third CMP process to expose a surface of the second gate.

11. The method of claim 10, wherein the third CMP process stops when the surface of the second gate is exposed.

12. The method of claim 10, further comprising, after the third CMP process:
Removing the second gate by etching to form a second trench;
forming a second work function metal layer in the second trench; and
forming a second metal gate layer on the second work function metal layer.

13. The method of claim 1, wherein the first type transistor region comprises a P-type metal gate transistor, and the second type transistor region comprises an N-type metal gate transistor.

14. The method of claim 1, wherein the first type transistor region comprises an N-type metal gate transistor, and the second type transistor region comprises a P-type metal gate transistor.

15. The method of claim 1, wherein the first type transistor region comprises a P-type metal gate transistor, and the second type transistor region comprises a polysilicon transistor.

16. The method of claim 1, wherein the first type transistor region comprises an N-type metal gate transistor, and the second type transistor region comprises a polysilicon transistor.

17. An electronic device comprising an electronic component and a semiconductor device electrically connected with the electronic component, the semiconductor device being fabricated by a process comprising the steps of:
providing a semiconductor substrate containing a front-end device, the front-end device comprising a first gate in a first type transistor region and a second gate in a second type transistor region;
forming an interlayer dielectric layer on the semiconductor substrate;
performing a first chemical mechanical polishing (CMP) process having a removal rate of the first and second gates higher than a removal rate of the interlayer dielectric layer on the interlayer dielectric layer so that a surface of the first gate and a surface of the second gate are below a surface of the interlayer dielectric layer after the first CMP process;
removing a portion of the second gate so that the second gate is lower than the interlayer dielectric layer;
forming a hard mask layer on the first gate, the second gate and the interlayer dielectric layer;
removing a portion of the hard mask layer disposed on the first type transistor region;
removing the first gate by etching using the hard mask layer as a mask to form a trench;
forming a first work function metal layer in the trench and on the hard mask layer over the second gate;
forming a metal gate layer on the first work function metal layer; and
forming a metal gate by performing a second CMP process to remove a portion of the first work function metal layer and a portion of the metal gate layer that are higher than the interlayer dielectric layer.

18. A method for manufacturing a semiconductor device, the method comprising:
providing a semiconductor substrate comprising a front-end device, the front-end device comprising a first gate in a first type transistor region and a second gate in a second type transistor region, the first and second gates comprising a polysilicon material, the second gate being wider than the first gate;
forming an interlayer dielectric layer on the semiconductor substrate;
performing a first chemical mechanical polishing (CMP) process on the interlayer dielectric layer to expose a surface of the first gate and a surface of the second gate;
performing a second CMP process having a removal rate of the first and second gates higher than a removal rate of the interlayer dielectric layer, thereby causing the surface of the first gate and second gate being lower than the surface of the interlayer dielectric layer;
forming a hard mask layer on the first gate, the second gate, and the interlayer dielectric layer;
removing a portion of the hard mask layer disposed on the first type transistor region;
removing the first gate by etching using the hard mask layer as a mask to form a trench;
forming a first work function metal layer in the trench and on the hard mask layer over the second gate;
forming a first metal gate layer on the first work function metal layer; and
forming a metal gate by performing a third CMP process to remove a portion of the first work function metal layer and a portion of the metal gate layer that are higher than the interlayer dielectric layer, the third CMP process has a high removal rate for the metal gate layer and for the first work function metal layer than for the interlayer dielectric layer, thereby leaving a portion of the first work function metal layer and a portion of the metal gate layer over the second gate;
performing a fourth CMP process to remove the portion of the first work function metal layer and the portion of the metal gate layer over the second gate, the fourth CMP process has a low polysilicon removal rate to avoid excessive over-polishing of the second gate.

* * * * *